United States Patent [19]

Furuyama

[11] Patent Number: 5,428,576
[45] Date of Patent: Jun. 27, 1995

[54] SEMICONDUCTOR DEVICE AND METHOD OF SCREENING THE SAME

[75] Inventor: Tohru Furuyama, Tokyo, Japan

[73] Assignee: Kabushiki Kaisha Toshiba, Kawasaki, Japan

[21] Appl. No.: 325,636

[22] Filed: Oct. 19, 1994

Related U.S. Application Data

[63] Continuation of Ser. No. 696,226, May 6, 1991, abandoned.

[30] Foreign Application Priority Data

May 11, 1990 [JP] Japan ................ 2-119948

[51] Int. Cl.⁶ .................... G11C 7/00; G11C 8/00
[52] U.S. Cl. ................. 365/201; 365/230.03; 365/230.06; 365/189.09
[58] Field of Search ........... 365/182, 201, 226, 230.03, 365/230.06, 189.09; 257/296, 298, 300

[56] References Cited

U.S. PATENT DOCUMENTS

| | | | |
|---|---|---|---|
| 4,751,679 | 6/1988 | Dehganpour | 365/201 |
| 4,809,231 | 2/1989 | Shannon et al. | 365/201 |
| 4,839,865 | 6/1989 | Sato et al. | 365/201 |
| 5,132,929 | 7/1992 | Ochii | 365/201 |

FOREIGN PATENT DOCUMENTS

| | | |
|---|---|---|
| 0080935A3 | 11/1982 | European Pat. Off. |
| 0080935A2 | 11/1982 | European Pat. Off. |
| 0080935 | 8/1983 | European Pat. Off. |
| 61-60157250 | 1/1984 | Japan |
| 0157250 | 12/1985 | Japan |

OTHER PUBLICATIONS

Co-pending United States Patent Application Ser. No. 544,615 Filed Jun. 27, 1990. Our File: 31601.

*Primary Examiner*—Robert P. Limanek
*Assistant Examiner*—Wael M. Fahmy
*Attorney, Agent, or Firm*—Banner, Birch, McKie & Beckett

[57] ABSTRACT

A semiconductor device comprising a plurality of circuit blocks to which various potentials, including at least one potential either raised or lowered, are assigned. The device further comprises means for selectively and reversely changing the potentials assigned to the circuit blocks.

17 Claims, 6 Drawing Sheets

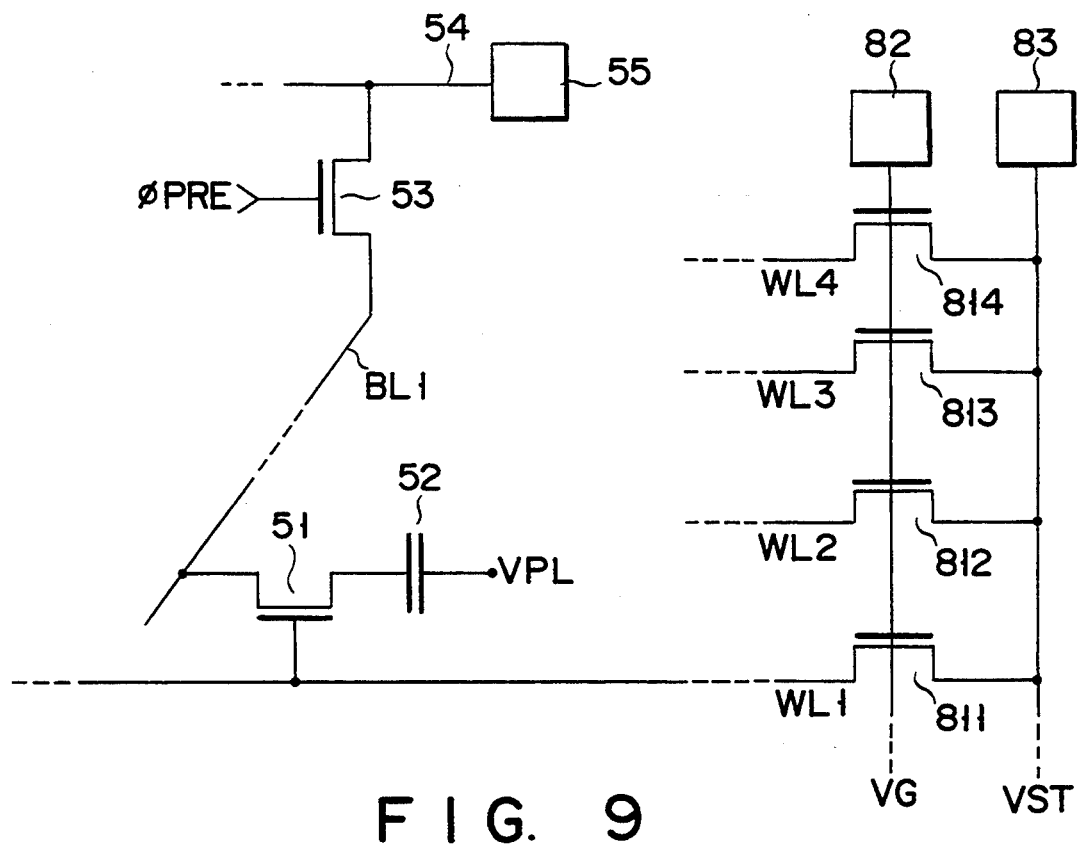
F I G. 9
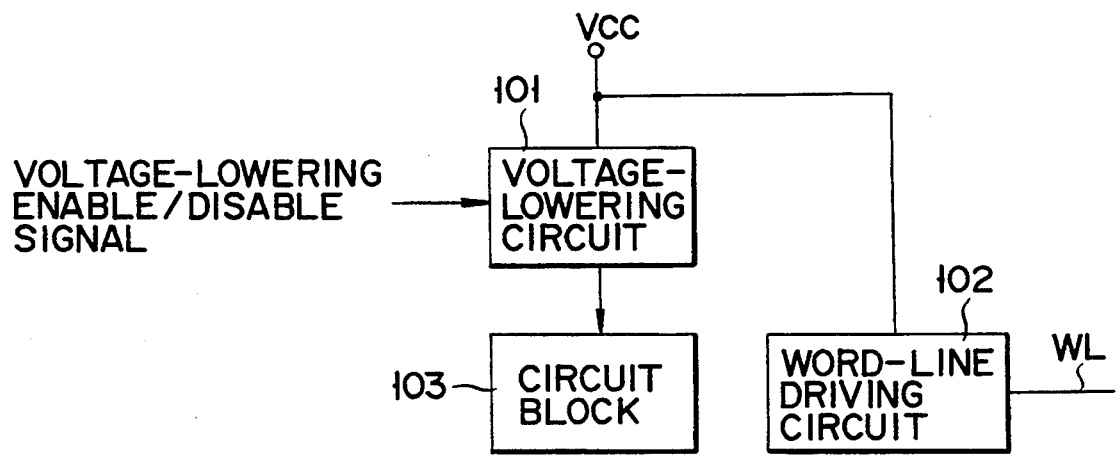
F I G. 10

SEMICONDUCTOR DEVICE AND METHOD OF SCREENING THE SAME

This application is a continuation of application Ser. No. 07/696,226, filed May 6, 1991 now abandoned.

BACKGROUND OF THE INVENTION

1. Field of the Invention

The present invention relates to a semiconductor device and, more particularly, to a semiconductor device wherein various potentials, including at least one potential either raised or lowered, are assigned to circuit blocks, and also to a method of screening this semiconductor device.

2. Description of the Related Art

Semiconductor devices are subjected to a test generally known as "screening" before they are shipped from the factory to users. The purpose of the screening is to find devices having defects which may eventually render the devices useless or malfunctioning, and discard these defective semiconductor devices. The known method of screening is to apply a voltage to the semiconductor devices, said voltage being higher than the driving voltage of the devices, for a time much shorter than the period during which the device may have troubles for the first time. Hence, the devices have, within a short time, the stress which would have been imposed on them if they were operated at their driving voltage a little longer than said period. Those of the devices which have troubles are discarded, and only the remaining reliable semiconductor devices are delivered to the users.

Hitherto, packaged DRAMs (Dynamic Random-Access Memories) have been screened by supplying address signals to their address input terminals, thereby accessing their word lines. This screening method is not efficient, in particular for checking the transfer gates of the memory cells of each DRAM.

In order to increase the screening efficiency, the inventors hereof invented the DRAM disclosed in U.S. patent application Ser. No. 544,614, which is so designed that a voltage stress can be applied to all word lines, or the word lines, the number of which is more than that of word lines selected for normal operation, at the same time. This DRAM can be screened before it is cut from a wafer. In other words, the identical DRAM chips formed on the same wafer can be screened within a short time by means of a prober and a probe card.

As is commonly practiced in the art, a raised voltage is applied to the word lines connected to the transfer gates of DRAM memory cells, so that a voltage as high as the power-supply potential of the DRAM to the memory nodes of the memory cells. More specifically, in a 4-Mbit DRAM or a DRAM having less storage capacity, a potential higher than the power-supply potential, which is the raised voltage, is applied to the word lines, while the power-supply potential is externally applied directly to most circuit blocks of the DRAM. In the case of a 16-Mbit DRAM, most circuit blocks are driven with an internal lowered power-supply voltage, and the word lines are driven with a raised internal power-supply potential, as is disclosed in M. Horiguchi et al., Dual Operating-Voltage Scheme for a Single 5 V, 16-Mbit DRAM, IEEE Journal of Solid-State Circuits, Vol. 23, No. 5, October 1988, pp. 1128–1132. Alternatively, in a 16-Mbit DRAM, most circuit blocks are driven with an internal lowered power-supply voltage, and the word lines are driven with an external power-supply potential, as is disclosed in T. Takeshima et al., A 55 ns 16 Mb DRAM, ISSCC 89, pp. 246–247.

In most DRAMs, the MOS transistors used as the transfer gates of the memory cells, and the MOS transistors incorporated in the circuits peripheral to the memory cells, have gate insulation layers of the same thickness. Hence, if the potential applied to the word lines is higher than the potential applied to the other elements of the DRAM, a greater voltage stress is imposed on the MOS transistors used as transfer gates than on the other MOS transistors. In the case of a DRAM driven with the externally applied power-supply potential Vcc, a voltage as high as 1.5 Vcc is applied to the word lines. When the DRAM is subjected to screening performed at 7 V, the potential of the word lines will amount to 10.5 V. Assuming that the transfer gates of the memory cells have a thickness of 200 A, the electric field applied to the transfer gates will have an intensity of more than 5 MV/cm.

The voltage that can be applied to screen DRAMs must be low enough not to break down the transfer gates of the memory cells to which the raised voltage is applied, or not to cause the junction breakdown of the diffusion layer to which the raised voltage is applied. When such a relatively low screening voltage is applied to a DRAM, an insufficiently intense electric field is applied to the elements other than the transfer gates and the diffusion layer. Consequently, the potential defects of the DRAM, if any, cannot be detected within a short period of time. In other words, it is necessary to carry out the screening on a DRAM for a long time in order to detect the defects, if at least one of the various potentials assigned to circuit blocks of the DRAM is either raised or lowered internally.

SUMMARY OF THE INVENTION

The object of the present invention is to provide a semiconductor device to which a relatively high screening voltage can be applied, thus shortening the screening time, and also to a method of screening this semiconductor device.

According to the invention, there is provided a semiconductor device which comprises a plurality of circuit blocks to which various potentials, including at least one potential either raised or lowered, are assigned, and means for selectively and reversibly changing the potentials assigned to the circuit blocks.

The semiconductor device of the invention is applied to a DRAM wherein a raised voltage is applied to the word lines, which is higher than the voltage applied to the other circuit elements. To subject the DRAM to screening, no voltage higher than the voltage applied to the other circuit elements is applied to the word lines connected to transfer gates of the memory cells. Hence, the screening voltage need not be low enough not to break down the transfer gates of the memory cells to which a raised voltage is applied, or not to cause the junction breakdown of the nodes to which the raised voltage is applied. The potential defects of the DRAM, if any, can therefore be detected within a short period of time. In other words, the screening time of the DRAM is very short.

According to the invention, there is provided a method of screening a semiconductor device which comprises a plurality of circuit blocks to which various potentials, including at least one potential either raised or lowered, are assigned. In the method, the potentials assigned to the circuit blocks are selectively and reversibly changed, and a specific voltage is applied to at least one of the circuit blocks, said specific voltage being not higher than the voltages applied to the other circuit blocks.

The screening method of the invention is applied to a DRAM which has means for electrically disconnecting the word lines from the word-line boost circuit or from the word-line driving circuit, or to a DRAM which has means for selectively applying a potential to the word lines. This method is characterized in that a voltage stress is applied to the word lines, independently of the voltage stress applied to the other circuit elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a circuit diagram illustrating part of a DRAM according to a fourth embodiment of the invention;

FIG. 10 is a block diagram showing a DRAM according to a fifth embodiment of the present invention;

DETAILED DESCRIPTION OF THE PREFERRED EMBODIMENTS

Some semiconductor devices, which are a few embodiments of the present invention will now be described, with reference to the accompanying drawings. In the description which follows, the components of an embodiment which are identical or similar to those of any other embodiment will be designated by the same numerals or symbols, and will not be repeatedly explained.

Figure 1:
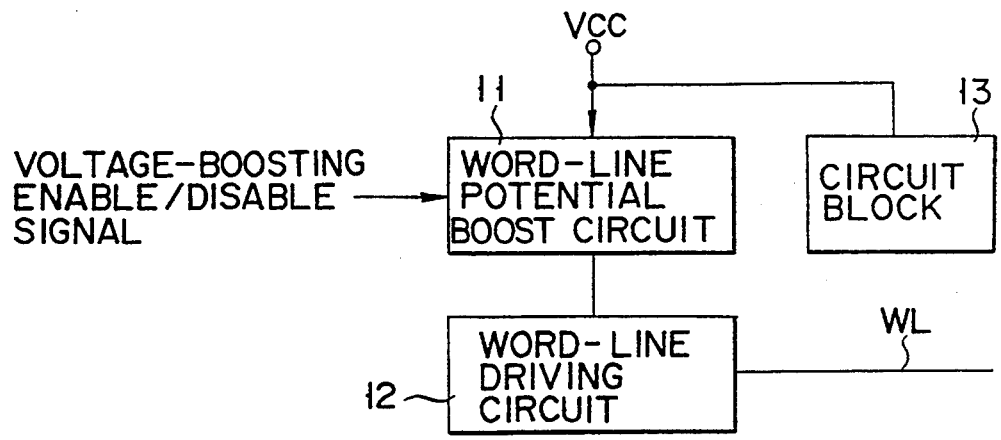
FIG. 1 is a block diagram showing a DRAM according to a first embodiment of the present invention.

FIG. 1 is a schematic representation of the DRAM according to the first embodiment of the invention. This DRAM has a plurality of circuit blocks. Various potentials are assigned to the circuit blocks, and at least one of these potentials is internally raised, as in the DRAM disclosed in S. Fujii et al., A 45 ns 16-Mbit DRAM with Triple-Well Structure, IEEE Journal of Solid-State Circuits, Vol. 24, No. 5, pp 1170–1175. The DRAM shown in FIG. 1 has means for selectively and reversibly changing the potentials assigned to the circuit blocks.

As is shown in FIG. 1, the DRAM comprises a word-line potential boost circuit 11, a word-line driving circuit 12, and another circuit block. The output potential of the circuit 11 is applied to the word-line driving circuit 12. A power-supply potential Vcc is applied to the other circuit block 13. A word line enable/disable signal is externally input to the wordline potential boost circuit 11. When this signal is at a high level, the circuit 11 is activated and raises the power-supply potential Vcc to a greater value, and outputs a raised potential. Conversely, when the control signal is at a low level, the circuit 11 is not activated and outputs the power-supply potential Vcc. Thus, the output potential of the word-line potential boost circuit 11 is reversibly changed, from the potential Vcc to a raised potential or from the raised voltage to the potential Vcc, in accordance with the level of the word line enable/disable signal.

The DRAM is so designed that the word-line potential boost circuit 11 is activated in order to select some of the word lines, and the raised potential is applied to the word-line driving circuit 12, while the lower, power-supply voltage Vcc is applied to the other circuit block 13. In order to perform screening on the DRAM, the circuit 11 is disabled by a word line enable/disable signal, whereby the power-supply potential Vcc is applied not only to the other circuit block 13, but also to the word-line driving circuit 12.

Figure 2:
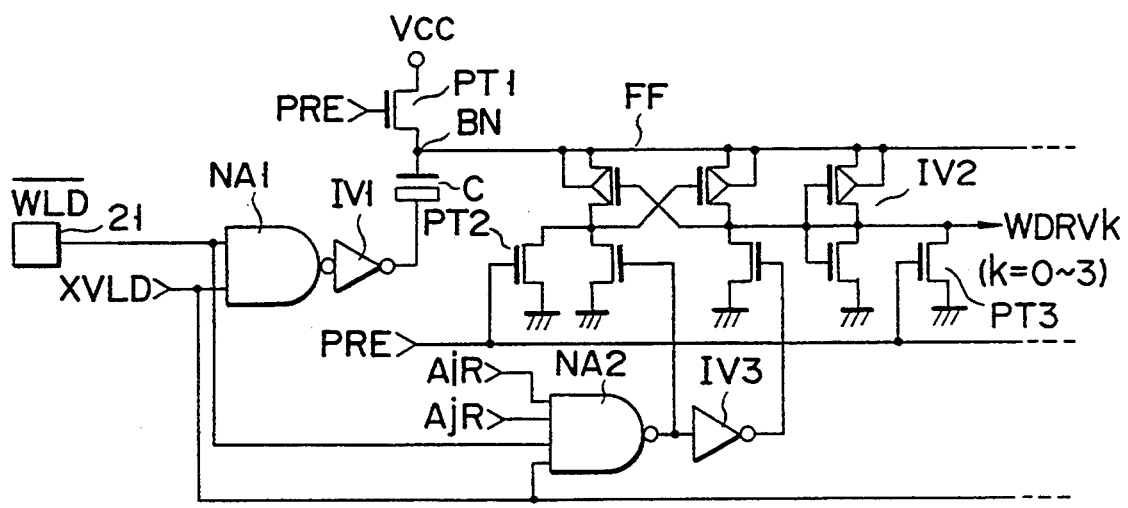
FIG. 2 is a circuit diagram illustrating part of the DRAM shown in FIG. 1.

FIG. 2 illustrates that section of the DRAM which has the circuits 11 and 12 incorporated in the DRAM. The circuits 11 and 12 are improvements of the word-line potential boost circuit and the word-line driving circuit, both disclosed in S. Fujii et al., A 45 ns 16-Mbit DRAM with Triple-Well Structure, IEEE Journal of Solid-State Circuits, Vol. 24, No. 5, pp. 1170–1175. This section of the DRAM is designed such that, while the DRAM is undergoing screening, no word lines are selected during screening of the DRAM, and the voltage applied to the circuits 11 and 12 is maintained at the same value as the power-supply potential Vcc applied to the other circuit block 13.

As is evident from FIG. 2, said section comprises a two-input NAND circuit NA1, three inverters IV1 to IV3, a voltage-boosting CMOS capacitor C, three precharging N-channel MOS transistors PT1 to PT3, a four-input NAND circuit NA2, a CMOS flip-flop circuit FF, and a terminal 21.

A word line disable signal $\overline{\text{WLD}}$ is externally supplied to the terminal 21. The signal $\overline{\text{WLD}}$ and a word line enable signal XVLD are input to the NAND circuit NA1. The output of the NAND circuit NA1 is coupled to the first inverter IV1. The first precharging transistor PT1 and the voltage-boosting capacitor C are coupled together, forming a series circuit. This series circuit is connected between a power-supply node (i.e., Vcc node) and the output terminal of the first inverter IV1. The second inverter IV2 is connected between the ground potential Vss and the node of the transistor PT1 and the capacitor C. The flip-flop circuit FF and the second inverter IV2 are connected between the ground potential Vss and the node (i.e., the voltage-boosting node BN).

The second precharging transistor PT2 is connected between the ground node (i.e., the Vss node) and the first output terminal of the flip-flop circuit FF. The third precharging transistor PT3 is connected between the ground potential Vss and the output terminal of the second inverter IV2. The gates of the precharging transistors PT1 to PT3 are connected to receive a precharge signal PRE.

The word line enable signal XVLD, an address signal AiR, an address signal AjR, and the word line disable signal $\overline{WLD}$ are supplied to the four-input NAND circuit NA2. The output of this NAND circuit NA2 is coupled to the third inverter IV3. The output of the NAND circuit NA2 and the output of the third inverter IV3 are connected to the two inputs of the flip-flop circuits FF, respectively.

Figure 3:
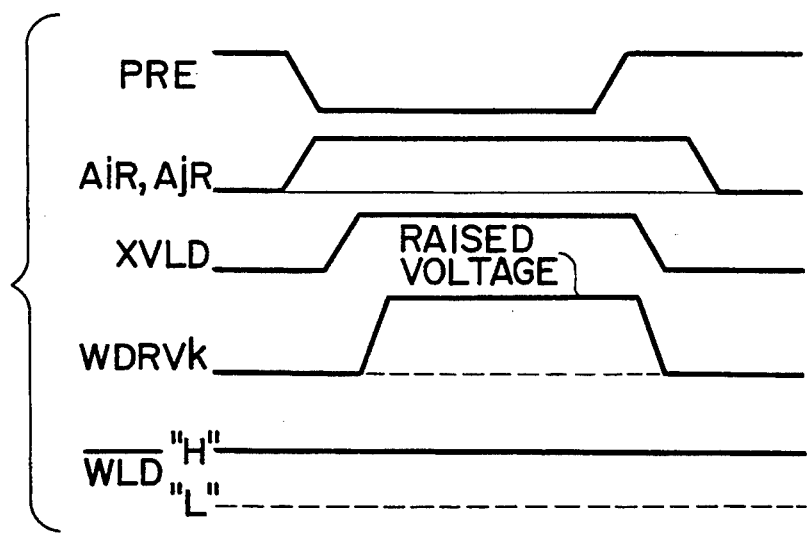
FIG. 3 is a timing chart explaining how the circuit of FIG. 2 operates.

FIG. 3 is a timing chart representing when the precharge signal PRE, the address signals AiR and AjR, the word line enable signal XVLD, a word line drive signal WDRVk, and the word line disable signal $\overline{WLD}$ are supplied to the circuit illustrated in FIG. 2. With reference to FIG. 3, the operation of the circuit shown in FIG. 2 will now be explained.

First, when the precharge signal PRE is disabled, or set at a low (L) level, the precharging transistors PT1 to PT3 are turned off. Then, both address signals AiR and AjR are set, whereby the word line enable signal XVLD is enabled, or set at a high (H) level.

In normal operating condition, the word line disable signal $\overline{WLD}$ remains disabled, or set at the high level. When the address signals AiR and AjR are set, and the word line enable signal XVLD is enabled, the output of the NAND circuit NA2 and that of the third inverter IV3 are set or defined. At the same time, the output of the first inverter IV1 rises to the high level, whereby a raised voltage, which is higher than the power-supply potential Vcc, is generated at the voltage-boosting node BN. The raised voltage is applied to the flip-flop circuit FF and also to the second inverter IV2. The second inverter IV2 generates a word line drive signal WDRVk from the raised voltage. The signal WDRVk, thus generated, is supplied to a word line WLk (not shown).

During the screening of the DRAM, the word line disable signal $\overline{WLD}$ remains enabled, or set at the low level. The output of the first inverter IV1 is therefore at the low level. Hence, the voltage-boosting node BN stays at the power-supply potential Vcc. The flip-flop circuit FF and the second inverter IV2 operate, using the power-supply potential as operating voltage. The output of the flip-flop circuit FF, i.e., the input of the second inverter IV2, rises to the high level since the four-input NAND circuit NA2 supplies the high-level output signal to the flip-flop circuit FF. As a result, the output of the second inverter IV2, i.e., the word line drive signal WDRVk, falls to the low level, and the word line WLk is not selected.

The section of the DRAM, which is shown in FIG. 2, has means for selectively and reversely changing the potential assigned to the word-line driving circuit 12. The potential-changing means functions such that, during the screening of the DRAM, no word lines are selected and the voltage applied to the word-line driving circuit 12 remains the same as the power-supply potential Vcc applied to the other circuit block 13. In other words, the voltage applied to the word lines remains not higher than the voltage applied to all other circuit elements. Therefore, the screening voltage need not be low enough not to break down the transfer gates of the memory cells to which a raised voltage is applied, or not to cause the junction breakdown of the nodes to which the raised voltage is applied. The circuit elements other than the transfer gates can, therefore, be screened with a voltage higher than the conventional DRAMs. Thus, the defects, if any in the circuit elements other than the transfer gates, can be detected within a short period of time, shortening the screening time of the DRAM.

If the DRAM shown in FIG. 1 is of such design that the electric field applied for screening the gate insulation films of the MOS transistors is intensified by, for example, 1 MV/cm, and that the gate insulation films have a thickness of 200 Å, the power-supply potential Vcc is 2 V higher than the power-supply potential used in the conventional DRAM comprising MOS transistors whose gate insulation films have the same thickness.

According to 1985 IRPS, 23rd Annual Proceedings, pp. 1–5, when the electric field applied to the gate insulation films having said thickness (200 Å) at a temperature of about 125° C. is intensified by 1 MV/cm, the screening time will be reduced about 1000 times. It usually takes about 24 hours to 48 hours to complete the screening of DRAMs, whereas only about 1.5 to 3 minutes is sufficient to screen the DRAM of FIG. 1, wherein an electric field intensified by 1 MV/cm can be applied to the gate insulation films of the MOS transistors. Obviously, the DRAM of FIG. 1 can be screened about 1000 times faster than the conventional DRAMs.

Figure 4:
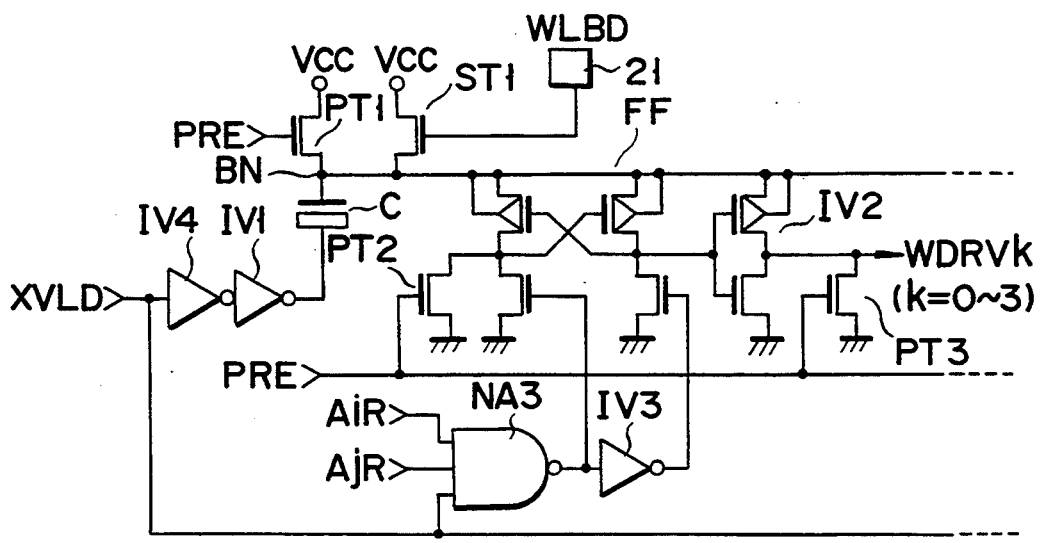
FIGS. 4 and 5 are circuit diagrams, each showing a modification of the circuit illustrated in FIG. 2.
Figure 5:
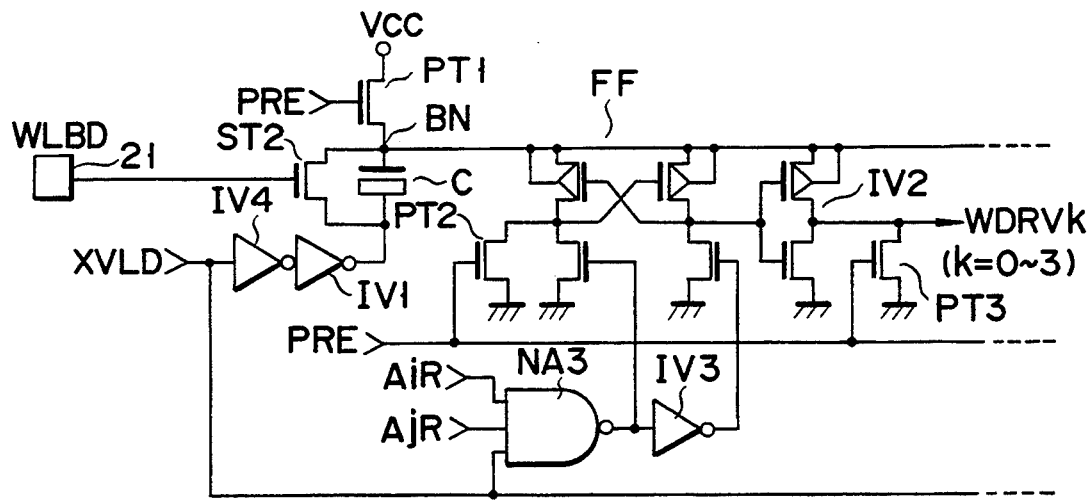

FIGS. 4 and 5 are circuit diagrams, each showing a modification of the circuit illustrated in FIG. 2. Either circuit is designed such that the word-line potential boost circuit 11 (shown in FIG. 1) is disabled while the DRAM is being screened, and the voltage applied to the word-line driving circuit 12 (also shown in FIG. 1) therefore remains, during the screening of the DRAM, the same as the power-supply potential Vcc applied to the other circuit block 13 (shown in FIG. 1).

The circuit of FIG. 4 is identical to the circuit of FIG. 2, except for four respects. First, an inverter IV4 is used in place of the two-input NAND circuit NA1, for receiving the word line enable control signal XVLD. Second, a three-input NAND circuit NA3 is incorporated in place of the four-input NAND circuit NA2, for receiving the word line enable signal XVLD, the address signal AiR, and the address signal AjR. Third, a switching N-channel MOS transistor ST1 is coupled between the Vcc node and the voltage-boosting node BN. Fourth, a word-line boost disable signal WLBD is fed to the gate of the switching transistor ST1.

The operation of the circuit shown in FIG. 4 will now be explained when the precharge signal PRE falls to the low level, the precharging transistors PT1 to PT3 are turned off. Then, both address signals AiR and AjR are set, whereby the word line enable signal XVLD is enabled, or set at a high (H) level.

In normal operating condition, the word-line boost disable signal WLBD remains disabled, or set at the low level. Hence, the switching transistor ST1 is off. When both address signals AiR and AjR are set, and the word-line enable signal XVLD is enabled, the output of the three-input NAND circuit NA3 and that of the inverter IV3 rise to the high level. As a result, a raised voltage, which is higher than the power-supply potential Vcc, is generated at the voltage-boosting node BN. The raised voltage is applied to the flip-flop circuit FF and also to the second inverter IV2.

During the screening of the DRAM, the word-line boost disable signal WLBD remains activated, or set at a lever higher than Vcc+Vth, where Vth is the threshold voltage of the switching transistor ST1. Hence, the switching transistor ST1 is turned on, and the voltage-boosting node BN is set at the power-supply potential Vcc. Thus, even if the output of the first inverter IV1 rises to the high level, all charge is supplied back the Vcc terminal. The flip-flop circuit FF and the second inverter IV2 operate, using the power-supply potential Vcc as operating voltage. The flip-flip circuit FF is driven by the output of the three-input NAND circuit NA3 and the output of the third inverter IV3. The output of the flip-flop circuit FF is inverted by the second inverter IV2. The output of the second inverter IV2 drives the word line WL (shown in FIG. 1).

The circuit of FIG. 5 is identical to the circuit of FIG. 4, except in two respects only. First, a switching N-channel MOS transistor ST2 is used in place of the switching transistor ST1 (FIG. 4) and is coupled in parallel to the voltage-boosting capacitor C. Second, the word-line boost disable signal WLBD is supplied to the gate of the switching transistor ST2.

The circuit of FIG. 5 operates almost in the same way as the circuit shown in FIG. 4, and its operation will not be described herein.

The DRAM including the circuit shown in FIG. 4 or FIG. 5 also has means for selectively and reversely changing the potential assigned to the word-line driving circuit 12. The potential-changing means disables the word-line potential boost circuit 11 (FIG. 1) while the DRAM is being screened, so that the voltage applied to the word-line driving circuit 12 remains the same as the power-supply potential Vcc applied to the other circuit block 13 though the word lines are selected. In other words, during the screening of the DRAM, the voltage applied to the word lines remains not higher than the voltage applied to all other circuit elements. More precisely, the the word lines WL are set at a potential of Vcc−Vth (Vth being the threshold voltage of the MOS transistors) during the screening of the DRAM. Therefore, the DRAM having the circuit of FIG. 4 or FIG. 5 can be screened within a short time.

Figure 6:
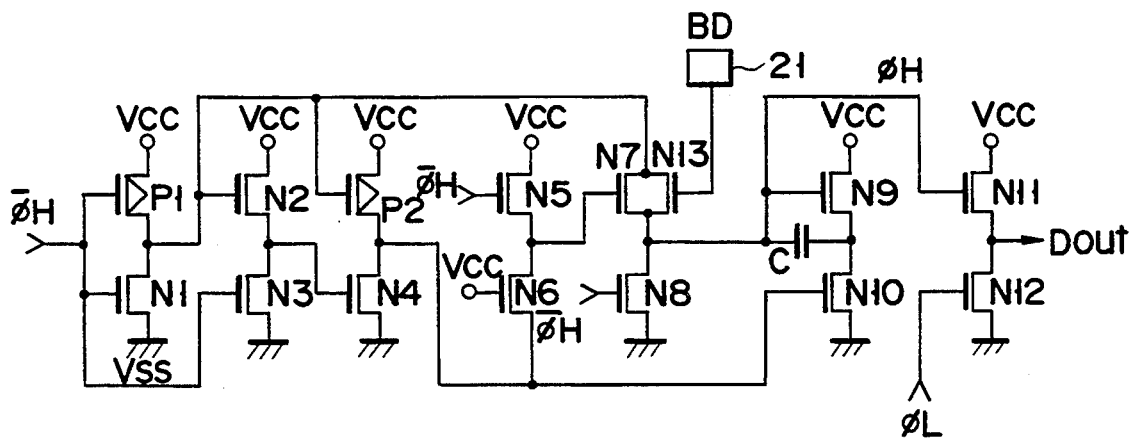
FIG. 6 is a circuit diagram showing part of a DRAM according to a second embodiment of the invention.

The present invention can be applied to another type of a DRAM, in which a potential assigned to specific elements other than the word lines can be selectively and reversely changed, said potential being far different from the potentials assigned to the other circuit elements, can be selectively and reversely changed. FIG. 6 illustrates an output buffer of the known type and a voltage-boosting circuit for applying a raised voltage to the output buffer, both incorporated in a DRAM which is the second embodiment of the invention. During the normal operation of this DRAM, the word lines and the output buffer are driven with the raised voltage, whereas the other circuit elements are driven with a potential lower than the raised voltage, so that the word lines are selected.

The circuit shown in FIG. 6 has means for selectively and reversely changing the potential assigned to the output buffer. As is shown in FIG. 6, the circuit comprises P-channel MOS transistors P1 and P2, N-channel MOS transistors N1 to N13, and a voltage-boosting capacitor C. The N-channel MOS transistor N13, which is a boost disable transistor, is connected in parallel to the N-channel MOS transistor N7 coupled to one end of the capacitor C which is incorporated in the output buffer and used as voltage-boosting element. A boost disable signal BD is supplied to the gate of the N-channel MOS transistor N13. The output signal obtained at the voltage-boosting node BN of the voltage-boosting circuit is supplied to the output buffer which is of the known type.

The operation of the circuit shown in FIG. 6 will be explained.

In normal operating condition, the signal BD remains at the low level, and the transistor N13 is off. Hence, the voltage-boosting circuit can perform its function. When the input signal $\phi H$ is at the low level, and the output signal $\phi H$ is at the low level, the input signal $\phi L$ of the output buffer is also at the low level. In this case, the data Dout output by the output buffer is "1." When the input signal $\phi H$ is at the high level, and the output signal $\phi H$ is at the low level, the input signal $\phi L$ of the output buffer is at the high level. In this case, the data Dout output by the output buffer is "0." Further, when the input signal $\phi H$ is at the high level, and the output signal $\phi H$ is at the low level, the input signal $\phi L$ of the output buffer is also at the low level. In this case, the data Dout output by the output buffer is at high impedance.

On the other hand, during the screening of the DRAM, the signal BD is raised to a level higher than Vcc+Vth, where Vth is the threshold voltage of the transistor N13. Hence, the transistor N13 is turned on. Thus, when the voltage at the voltage-boosting node BN is boosted by means of the voltage-boosting capacitor C, the charge is transferred from the node BN to the Vcc node through the transistor N13 and the P-channel transistor P1 at the input stage. The signal $\phi H$ can no longer be boosted.

Figure 7:
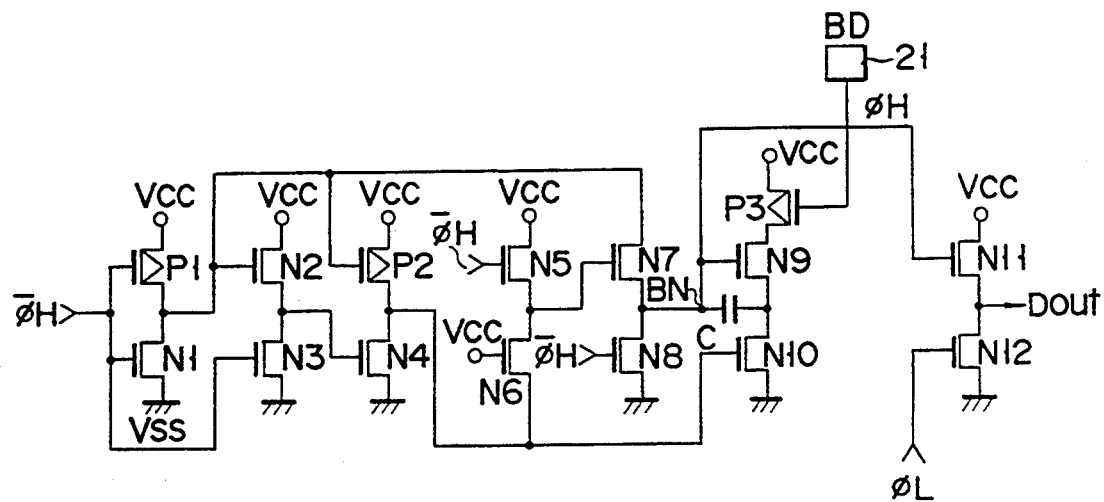
FIG. 7 is a circuit diagram representing a modification of the circuit shown in FIG. 6.

FIG. 7 shows a modification of the circuit shown in FIG. 6. This circuit is characterized by the use of a P-channel MOS transistor P3 which functions as a boost disable transistor. The transistor P3 is connected between the Vcc node and the N-channel transistor N9 coupled to the other end of the voltage-boosting capacitor C. A boost disable signal BD is supplied to the gate of the P-channel MOS transistor P3. The output signal obtained at the voltage-boosting node BN of the voltage-boosting circuit is supplied to the output buffer which is of the known type.

The operation of the circuit illustrated in FIG. 7 will now be explained.

In normal operating condition, the signal BD is at the low level, whereby the transistor P3 remains on. Hence, the voltage-boosting circuit can raise the voltage in the same way as its equivalent does in the circuit illustrated in FIG. 6. During the screening of the DRAM, the signal BD is set at the Vcc level, whereby the transistor P3 remains off. The voltage-boosting capacitor can no longer accumulate charge, and the signal $\phi H$ cannot be boosted at all.

As can be understood from the above, while the DRAM having either the circuit of FIG. 6 or the circuit of FIG. 7 is being screened, the voltage-boosting circuit is disabled, so that the driving voltage applied to the output buffer is equal to the power-supply potential Vcc applied to the other circuits of the DRAM. In other words, no voltages higher than the power-supply potential Vcc can be applied to the output buffer during the screening of the DRAM.

Figure 8:
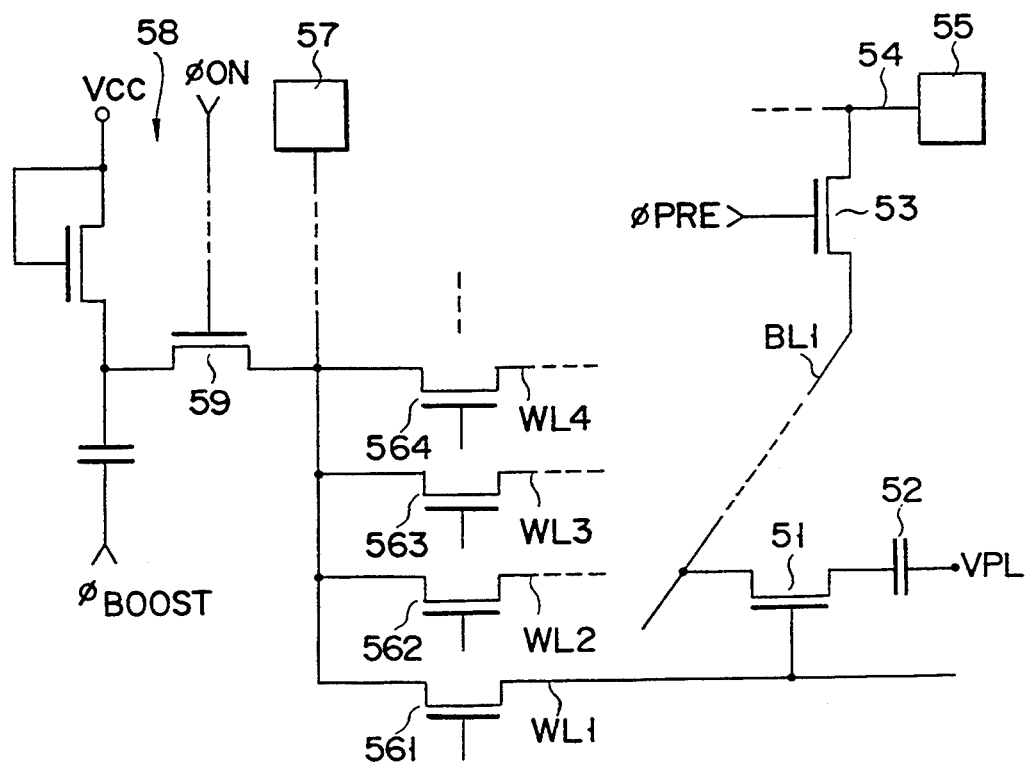
FIG. 8 is a circuit diagram showing part of a DRAM according to a third embodiment of this invention.

FIG. 8 shows a part of a DRAM according to a third embodiment of this invention. This DRAM is similar to the semiconductor memory disclosed in U.S. patent application Ser. No. 544,614. It has means for electrically disconnecting the word lines from a word-line boost circuit or from a word-line driving circuit. During the screening of the DRAM, a voltage stress is applied to the word lines, independently of the voltage stress applied to the other circuit elements.

As is evident from FIG. 8, the circuit comprises a a MOS transistor 51, a capacitor 52, a bit line BL1, a bit-line precharging MOS transistor 53, a bit-line precharging power-supply line 54, a pad 55, word lines WL1, WL2, ..., word-line selecting MOS transistors 561, 562, ..., a pad 57, a word-line potential boost circuit 58, and a transfer-gate MOS transistor 59.

The transistor 51 and the capacitor 52 form a memory cell. The pad 55 is coupled to the bit-line precharging power-supply line 54, and is not used in normal operating condition of the DRAM. The word-line selecting MOS transistors 561, 562, ... are connected at a first end to the word lines WL1, WL2, ..., respectively, and connected together at the second end. The gates of these transistors 561, 562, ... are connected to receive decoded address signals. The pad 57 is coupled to the second end of each word-line selecting MOS transistor 561, 562, ... and is not used in the normal operating condition of the DRAM. The transfer-gate MOS transistor 59 is connected between the word-line potential boost circuit 58, on the one hand, and the second ends of the MOS transistors 561, 562, ....

In operation, a capacitor-plate potential VPL is applied to the first electrode of the capacitor 52, a precharge signal φPRE is supplied to the gate of the bit-line precharging MOS transistor 53, a voltage boost signal φBOOST is supplied to the drain of the transfer-gate MOS transistor 59 through a capacitor, and a transfer-gate control signal φON is supplied to the gate of the transfer-gate MOS transistor 59.

The operation of the circuit shown in FIG. 8 will now be explained.

In the normal operating condition of the DRAM, the transfer-gate MOS transistor 59 is turned on, and the word-line selecting MOS transistors 561, 562, ... are selectively turned on in accordance with the decoded address signals. To screen the DRAM which is still on a wafer, together with many identical DRAMs, the MOS transistor 59 is turned off, and the word lines are electrically disconnected from the word-line potential boost circuit 58, all word-line selecting MOS transistors 561, 562, ... are turned on, and a desired voltage stress is externally applied to the pad 57. Hence, all word lines WL1, WL2, ... can be driven by means of the word-line selecting MOS transistors 561, 562, .... While the word lines WL1, WL2, ... are being driven, the MOS transistor 53 can be turned on, thereby to apply a desired voltage (e.g., the ground potential Vss) to the pad 55 in order to apply a desired voltage to the bit line BL1.

FIG. 9 illustrates a part of a DRAM according to a fourth embodiment of the invention. This DRAM is similar to one of the embodiments of the semiconductor memory disclosed in U.S. patent application Ser. No. 544,614. The circuit shown in FIG. 9 is characterized in two respects. First, it has means for selectively applying a potential to the word lines. Second, during the screening of the DRAM, a voltage stress is applied to the word lines, independently of the voltage stress applied to the other circuit elements.

The circuit of FIG. 9 comprises a MOS transistor 51, a capacitor 52, a bit line BL1, a bit-line precharging MOS transistor 53, a bit-line precharging power-supply line 54, a pad 55, word lines WL1, WL2, MOS transistor 811, 812, ..., a pad 82, a pad 83.

The transistor 51 and the capacitor 52 constitute a memory cell. The pad 55 is connected to the line 54 and is not used in normal operating condition of the DRAM. The MOS transistors 811, 812, ... have their sources connected to the word lines WL1, WL2, ..., respectively, their gates connected together and to the pad 82, and their drains connected together and to the pad 83. The pad 82 is not used in normal operating condition of the DRAM. Similarly, the pad 83 is not used in normal operating condition of the DRAM. The pad 83 is provided for applying a voltage stress to the word lines WL1, WL2, ....

The operation of the circuit shown in FIG. 9 will be explained.

In normal operating condition of the DRAM, a word-line selecting circuit (not shown) drives a transfer gate (not shown, either) in accordance with the word-line select signals generated by decoding an address signal. As a result, some of the transfer gates 811, 812, ... are driven, thereby selecting the word lines connected to the transfer gates thus driven.

To screen the DRAM which is still on a wafer, together with many identical DRAMs, all circuit elements, but the word lines WL1, WL2, ..., are disabled, a desirable voltage stress is externally applied to the word lines WL1, WL2, ... through the pad 83. In other words, a stress voltage VST is applied to the pad 83, and a gate control voltage VG higher than VST+Vth (where Vth is the threshold voltage of the MOS transistors 811, 812, ...), while no operating power is supplied to the DRAM, thereby turning on the MOS transistors 811, 812, ....

With the DRAM having the circuit of FIG. 8 or the circuit of FIG. 9, it is possible to prevent the word lines from being set at a potential higher than the voltage applied to any other circuit elements. Hence, the circuit elements other than the word lines can be screened by using a voltage higher than the conventional DRAM. The word lines can be subjected to screening, independently of the other circuit elements. A DC voltage stress can therefore be applied to all word lines (i.e., more word lines than are selected during the normal DRAM operation) at the same time. It takes only 1.5 to 3 minutes to screen the word lines. Also, it takes only 1.5 to 3 minutes to screen all other circuit elements, as in the DRAM having the circuit shown in FIG. 2.

Hence, it takes about 3 to 6 minutes to screen the DRAM having the circuit of FIG. 8 or FIG. 9. Obviously, the DRAM can be screened much faster than the conventional DRAMs which need to be screened for 24 to 48 hours. Since the screening time for the DRAM having the circuit of FIG. 8 or FIG. 9 is only 3 to 6 minutes, the DRAM can be screened, along with other identical DRAMs formed on the same wafer, by means of a prober and a probe card.

Semiconductor devices falling within the scope of the invention can be classified into the following types, in accordance with the potentials assigned to the circuit blocks of each device. The first type is one wherein an external power-supply potential is assigned to some of the circuit blocks, and a higher potential obtained by internally boosting the power-supply potential is assigned to the remaining circuit blocks. The second type is one wherein an external power-supply potential is assigned to some of the circuit blocks, and a lower potential obtained by internally lowering the power-supply potential is assigned to the other circuit blocks. The third type is one wherein an internal power-supply potential obtained by internally lowering an externally applied power-supply potential is assigned to some of the circuit blocks, and a higher potential obtained by boosting the internal power-supply potential is assigned to the other circuit blocks. The fourth type is one wherein an internal power-supply potential obtained by internally lowering an externally applied power-supply potential is assigned to some of the circuit blocks, and a lower voltage obtained by internally lowering the internal power-supply potential as assigned to the other circuit.

FIG. 10 schematically shows a DRAM according to a fifth embodiment of the present invention, which is of the second-type semiconductor device defined above. This DRAM comprises a plurality of circuit blocks to which various potentials, including at least one potential internally lowered, are assigned, and means for selectively and reversely changing the potentials as signed to the circuit blocks. As is shown in FIG. 10, this DRAM comprises a voltage-lowering circuit 101, a word-line driving circuit 102, a circuit block 103, and a word line WL. A power-supply potential Vcc is applied to the voltage-lowering circuit 101 and also to the word-line driving circuit 102. The output of the voltage-lowering circuit 101 is supplied to the circuit block 103. A voltage-lowering enable/disable signal is input to the voltage-lowering circuit 101. In accordance with this signal, the circuit 101 applies either the potential Vcc or a voltage lower than the potential Vcc to the circuit block 103.

In normal operating condition of the DRAM shown in FIG. 10, the voltage-lowering enable/disable signal is at a high level, whereby the circuit 101 applies the power-supply potential Vcc to the word-line driving circuit 102 and the lower voltage to the circuit block 103. During the screening of the DRAM, the signal is at a low level, whereby the circuit 102 applies the power-supply potential Vcc to both the word-line driving circuit 102 and the circuit block 103.

In the present invention, four means can be used to supply the DRAM with screening signals, such as a word line disable signal $\overline{WLD}$, a word-line boost disable signal WLBD and a boost disable signal BD. The signal-supplying means will be described.

The first signal-supplying means supplies the screening signals to the DRAM still formed on a wafer, along with many other identical DRAMs, via a screening-signal pad formed on the DRAM chip, or to the DRAM already cut from a wafer and packaged, via screening-signal terminals.

The second signal-supplying means is applied to a 4 Mb-DRAM. It generates screening signals on the DRAM chip in response to the address-key code designating the WCBR (WE and CAS before RAS) mode defined by JEDEC (Joint Electron Devices Engineering Council). More specifically, this signal-supplying means supplies the screening signals to the DRAM if the RAS (Row Address Strobe) signal is enabled after the WE (Write Enable) signal and the CAS (Column Address Strobe) signal have been enabled, so that the DRAM can be tested.

The third signal-supplying means comprises a circuit for detecting whether or not signals have externally input to the terminals of a DRAM, in the order in which these signals should not be input in normal operating condition of the DRAM. The signal output by this detecting circuit is used as a screening signal.

The fourth signal-supplying means comprises a circuit for detecting whether or not signals, which are not used in normal operation of a DRAM (e.g., a 7 V-signal in the case where the power-supply potential Vcc is 5 V), have been externally supplied to the terminals of the DRAM. The signal output by this detecting circuit is used as a screening signal.

Figure 11:
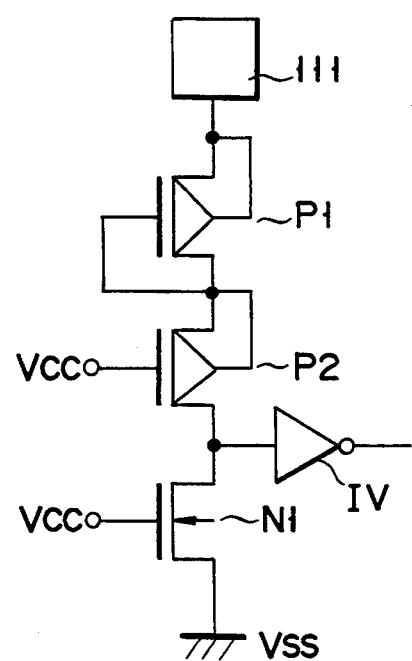
FIG. 11 is a circuit diagram illustrating a circuit for generating and supplying a screening signal to any semiconductor device according to this invention.

FIG. 11 illustrates an example of the fourth signal-supplying means, more precisely a three-value control circuit for detecting that a voltage higher than a predetermined value has been applied to an address terminal 111 for the most significant bit.

As is shown in FIG. 11, this control circuit comprises two P-channel MOS transistors P1 and P2 and an N-channel MOS transistor N1 coupled in series, thus forming a series circuit which is connected between the address terminal 111 and the ground potential Vss. The gate and drain of the transistor P1 are coupled together. A power-supply potential Vcc is applied to the gates of the transistors P2 and N1. The control circuit further comprises an inverter IV connected to the node of the transistors P2 and N1.

When a high-level potential (Vcc) or a low-level potential (Vss) is applied to the address terminal 111, the transistors P1 and N1 are turned off and on, respectively. Now that the transistor N1 is on, the potential at the input node of the inverter IV is at the low level. The screening signal output by the inverter IV is therefore set at the high level (i.e., the disable level).

When a control voltage Vcc+2Vthp (Vthp: the threshold voltage of the P-channel MOS transistor P1), i.e., a voltage higher than Vcc, is applied to the address terminal 111, the transistor P1 is turned on, whereby the potential at the input node of the inverter IV rises above Vcc. As a result of this, the screening signal output by the inverter IV is set at the low level (i.e., the enable level).

Various embodiments of the invention have been described, with reference the accompanying drawings. Nonetheless, the present invention is not limited to these embodiments. Rather, various changes and modifications can be made within the spirit of the invention and within the scope as is defined in the appended claims.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:
a potential source having a first potential;
first and second circuit blocks, said first circuit block connected to said potential source and applied with said first potential during both a stress test operation of said semiconductor device and a normal operation of said semiconductor device; and
a potential boosting circuit coupled to said potential source and to said second circuit block, said potential boosting circuit responsive to a boosting circuit disable signal during one of the stress test operation and the normal operation for outputting said first potential to said second circuit block and responsive to a boosting circuit enable signal during the other of the stress test operation and the normal operation for outputting a second potential internally boosted from said first potential to said second circuit block;

wherein said potential boosting circuit comprises:
a first logic gate having a first input receiving said boosting circuit enable signal, a second input receiving said boosting circuit disable signal, and an output;
a first inverter having an input connected to said output of said first logic gate, and an output;
a voltage boosting capacitor having a first terminal connected to said output of said first inverter, and a second terminal;
a first precharge transistor having a first terminal connected to said potential source, a second terminal connected to said second terminal of said voltage boosting capacitor, and a gate applied with a precharge signal;
a flip-flop circuit connected to a node between said second terminal of said voltage boosting capacitor and said second terminal of said first precharge transistor and a reference potential, said flip-flop having first and second inputs and first and second outputs;
a second precharge transistor having a first terminal connected to said first output of said flip-flop, a second terminal connected to said reference potential, and a gate applied with said precharge signal;
a second inverter having an input connected to said second output of said flip-flop, and an output;
a third precharge transistor having a first terminal connected to said output of said second inverter, a second terminal connected to said reference potential, and a gate applied with said precharge signal;
a second logic gate having at least one input receiving address data, a second input receiving said boosting circuit enable signal, a third input receiving said boosting circuit disable signal, and an output connected to said first input of said flip-flop; and
a third inverter having an input connected to said output of said second logic gate and an output connected to said second input of said flip-flop.

2. A semiconductor device, comprising:
a potential source having a first potential;
first and second circuit blocks, said first circuit block connected to said potential source and applied with said first potential during both a stress test operation of said semiconductor device and a normal operation of said semiconductor device; and
a potential boosting circuit coupled to said potential source and to said second circuit block, said potential boosting circuit responsive to a boosting circuit disable signal during one of the stress test operation and the normal operation for outputting said first potential to said second circuit block and responsive to a boosting circuit enable signal during the other of the stress test operation and the normal operation for outputting a second potential internally boosted from said first potential to said second circuit block;

wherein said potential boosting circuit comprises:
a first inverter having an input receiving said boosting circuit enable signal, and an output;
a second inverter having an input connected to said output of said first inverter, and an output;
a voltage boosting capacitor having a first terminal connected to said output of said second inverter, and a second terminal;
a first precharge transistor having a first terminal connected to said potential source, a second terminal connected to said second terminal of said voltage boosting capacitor, and a gate applied with a precharge signal;
a flip-flop circuit connected to a node between said second terminal of said voltage boosting capacitor and said second terminal of said first precharge transistor and a reference potential, said flip-flop having first and second inputs and first and second outputs;
a second precharge transistor having a first terminal connected to said first output of said flip-flop, a second terminal connected to said reference potential, and a gate applied with said precharge signal;
a third inverter having an input connected to said second output of said flip-flop, and an output;
a third precharge transistor having a first terminal connected to said output of said third inverter, a second terminal connected to said reference potential, and a gate applied with said precharge signal;
a logic gate having at least one input receiving address data, a second input receiving said boosting circuit enable signal, and an output connected to said first input of said flip-flop;
a fourth inverter having an input connected to said output of said logic gate and an output connected to said second input of said flip-flop; and
a switching transistor having a first terminal connected to said potential source, a second terminal connected to said node between said second terminal of said voltage boosting capacitor and said second terminal of said first precharge transistor, and a gate receiving said boosting circuit disable signal.

3. A semiconductor device comprising:
a potential source having a first potential;
first and second circuit blocks, said first circuit block connected to said potential source and applied with said first potential during both a stress test operation of said semiconductor device and a normal operation of said semiconductor device; and
a potential boosting circuit coupled to said potential source and to said second circuit block, said potential boosting circuit responsive to a boosting circuit disable signal during one of the stress test operation and the normal operation for outputting said first potential to said second circuit block and responsive to a boosting circuit enable signal during the other of the stress test operation and the normal operation for outputting a second potential internally boosted from said first potential to said second circuit block;

wherein said potential boosting circuit comprises:
a first inverter having an input receiving said boosting circuit enable signal, and an output;
a second inverter having an input connected to said output of said first inverter, and an output;
a voltage boosting capacitor having a first terminal connected to said output of said second inverter, and a second terminal;

a first precharge transistor having a first terminal connected to said potential source, a second terminal connected to said second terminal of said voltage boosting capacitor, and a gate applied with a precharge signal;

a flip-flop circuit connected to a node between said second terminal of said voltage boosting capacitor and said second terminal of said first precharge transistor and a reference potential, said flip-flop having first and second inputs and first and second outputs;

a second precharge transistor having a first terminal connected to said first output of said flip-flop, a second terminal connected to said reference potential, and a gate applied with said precharge signal;

a third inverter having an input connected to said second output of said flip-flop, and an output;

a third precharge transistor having a first terminal connected to said output of said third inverter, a second terminal connected to said reference potential, and a gate applied with said precharge signal;

a logic gate having at least one input receiving address data, a second input receiving said boosting circuit enable signal, and an output connected to said first input of said flip-flop;

a fourth inverter having an input connected to said output of said logic gate and an output connected to said second input of said flip-flop; and a switching transistor having a first terminal connected to a node between an output of said second inverter and said first terminal of said voltage boosting capacitor, a second terminal connected to said node between said second terminal of said voltage boosting capacitor and said second terminal of said first precharge transistor, and a gate receiving said boosting circuit disable signal.

4. A semiconductor device, comprising:

a potential source having a first potential;

an output buffer;

a potential changing circuit coupled to said potential source and to said output buffer, said potential changing circuit responsive to a changing circuit control signal during one of a stress test operation and a normal operation for outputting said first potential to said output buffer and responsive to said changing circuit control signal during the other of the stress test operation and the normal operation for outputting a second potential different than said first potential to said output buffer;

wherein said potential changing circuit comprises:

a first MOS transistor of a first conductivity type having a first terminal connected to said potential source, a second terminal, and a gate receiving an input signal;

a second MOS transistor of a second conductivity type having a first terminal connected to said second terminal of said first MOS transistor, a second terminal connected to a reference potential, and a gate receiving said input signal;

a third MOS transistor of the second conductivity type having a first terminal connected to said potential source, a second terminal, and a gate connected to a first connection node between said first terminal of said second MOS transistor and said second terminal of said first MOS transistor;

a fourth MOS transistor of the second conductivity type having a first terminal connected to said second terminal of said third MOS transistor, a second terminal connected to said reference potential, and a gate receiving said input signal;

a fifth MOS transistor of the first conductivity type having a first terminal connected to said potential source, a second terminal, and a gate connected to said first connection node;

a sixth MOS transistor of the second conductivity type having a first terminal connected to said second terminal of said fifth MOS transistor, a second terminal connected to said reference potential, and a gate connected to a second connection node between said first terminal of said fourth MOS transistor and said second terminal of said third MOS transistor;

a seventh MOS transistor of the second conductivity type having a first terminal connected to said potential source, a second terminal, and a gate receiving said input signal;

an eighth MOS transistor of the second conductivity type having a first terminal connected to said second terminal of said seventh MOS transistor, a second terminal connected to a third connection node between said first terminal of said sixth MOS transistor and said second terminal of said fifth MOS transistor, and a gate connected to said potential source;

a ninth MOS transistor of the second conductivity type having a first terminal connected to said first connection node, a second terminal, and a gate connected to a fourth connection node between said first terminal of said eighth MOS transistor and said second terminal of said seventh MOS transistor;

a tenth MOS transistor of the second conductivity type having a first terminal connected to said second terminal of said ninth MOS transistor, a second terminal connected to said reference potential, and a gate receiving said input signal;

an eleventh MOS transistor having a first terminal connected to said first terminal of said ninth MOS transistor, a second terminal connected to said second terminal of said ninth MOS transistor, and a gate receiving said changing circuit control signal;

a twelfth MOS transistor of the second conductivity type having a first terminal connected to said potential source, a second terminal, and a gate connected to a fifth connection node between said first terminal of said tenth MOS transistor and said second terminal ninth MOS transistor;

a thirteenth MOS transistor of the second conductivity type having a first terminal connected to said second terminal of said twelfth MOS transistor, a second terminal connected to said reference potential, and a gate connected to said third connection node; and a capacitor having a first terminal connected to said fifth connection node and a second terminal connected to a sixth connection node between said first terminal of said thirteenth MOS transistor and said second terminal of said twelfth MOS transistor.

5. A semiconductor device, comprising:

a potential source having a first potential;
an output buffer;
a potential changing circuit coupled to said potential source and to said output buffer, said potential changing circuit responsive to a changing circuit control signal during one of a stress test operation and a normal operation for outputting said first potential to said output buffer and responsive to said changing circuit control signal during the other of the stress test operation and the normal operation for outputting a second potential different than said first potential to said output buffer;
wherein said potential changing circuit comprises:
  a first MOS transistor of a first conductivity type having a first terminal connected to said potential source, a second terminal, and a gate receiving an input signal;
  a second MOS transistor of a second conductivity type having a first terminal connected to said second terminal of said first MOS transistor, a second terminal connected to a reference potential, and a gate receiving said input signal;
  a third MOS transistor of the second conductivity type having a first terminal connected to said potential source, a second terminal, and a gate connected to a first connection node between said first terminal of said second MOS transistor and said second terminal of said first MOS transistor;
  a fourth MOS transistor of the second conductivity type having a first terminal connected to said second terminal of said third MOS transistor, a second terminal connected to said reference potential, and a gate receiving said input signal;
  a fifth MOS transistor of the first conductivity type having a first terminal connected to said potential source, a second terminal, and a gate connected to said first connection node;
  a sixth MOS transistor of the second conductivity type having a first terminal connected to said second terminal of said fifth MOS transistor, a second terminal connected to said reference potential, and a gate connected to a second connection node between said first terminal of said fourth MOS transistor and said second terminal of said third MOS transistor;
  a seventh MOS transistor of the second conductivity type having a first terminal connected to said potential source, a second terminal, and a gate receiving said input signal;
  an eighth MOS transistor of the second conductivity type having a first terminal connected to said second terminal of said seventh MOS transistor, a second terminal connected to a third connection node between said first terminal of said sixth MOS transistor and said second terminal of said fifth MOS transistor, and a gate connected to said potential source;
  a ninth MOS transistor of the second conductivity type having a first terminal connected to said first connection node, a second terminal, and a gate connected to a fourth connection node between said first terminal of said eighth MOS transistor and said second terminal of said seventh MOS transistor;
  a tenth MOS transistor of the second conductivity type having a first terminal connected to said second terminal of said ninth MOS transistor, a second terminal connected to said reference potential, and a gate receiving said input signal;
  an eleventh MOS transistor of the first conductivity type having a first terminal connected to said potential source, a second terminal, and a gate receiving said changing circuit control signal;
  a twelfth MOS transistor of the second conductivity type having a first terminal connected to said second terminal of said eleventh MOS transistor, a second terminal, and a gate connected to a fifth connection node between said first terminal of sid tenth MOS transistor and said second terminal of said ninth MOS transistor;
  a thirteenth MOS transistor of the second conductivity type having a first terminal connected to said second terminal of said twelfth MOS transistor, a second terminal connected to said reference potential, and a gate connected to said third connection node; and
  a capacitor having a first terminal connected to said fifth connection node and a second terminal connected to a sixth connection node between said first terminal of said thirteenth MOS transistor and said second terminal of said twelfth MOS transistor.

6. A semiconductor device, comprising:
a potential boosting circuit which is applied with a first power-supply potential during a normal operation of said semiconductor device and outputs a second power-supply potential by internally boosting said first power-supply potential in response to a boosting enable signal during the normal operation, and which is applied with a third power-supply potential during a voltage stress test of said semiconductor device and outputs said third power-supply potential in response to a boosting disable signal during the voltage stress test;
a first circuit block applied with said first power-supply potential during the normal operation and applied with said third power-supply potential during the voltage stress test; and
a second circuit block applied with said second power-supply potential from said potential boosting circuit during the normal operation and applied with said third power-supply potential from said potential boosting circuit during the voltage stress test.

7. The semiconductor device according to claim 6, wherein said third power-supply potential is higher than said first power-supply potential.

8. The semiconductor device according to claim 6, wherein said first power-supply potential and said third power-supply potential are externally applied potentials.

9. The semiconductor device according to claim 6, wherein said first power-supply potential and said third power-supply potential are internal potentials generated by lowering externally applied potentials.

10. A semiconductor device, comprising:
a potential lowering circuit which is applied with a first power-supply potential during a normal operation of said semiconductor device and outputs a second power-supply potential by internally lowering said first power-supply potential in response to a lowering enable signal during the normal operation, and which is applied with a third power-supply potential during a voltage stress test of said semiconductor device and outputs said third power-supply potential in response to a lowering disable signal during the voltage stress test;

a first circuit block applied with said first power-supply potential during the normal operation and applied with said third power-supply potential during the voltage stress test; and a second circuit block applied with said second power-supply potential from said potential lowering circuit during the normal operation and applied with said third power-supply potential from said potential lowering circuit during the voltage stress test.

11. The semiconductor device according to claim 10, wherein said third power-supply potential is equal to said first power-supply potential.

12. The semiconductor device according to claim 10, wherein said first power-supply potential and said third power-supply potential are externally applied potentials.

13. The semiconductor device according to claim 10, wherein said first power-supply potential and said third power-supply potential are internal potentials generated by lowering externally applied potentials.

14. A semiconductor device according to any one of claims 6, 7, 8, and 9, further comprising a memory cell and a word line connected to said memory call, wherein said second circuit block includes a word line driving circuit for driving and said word line; and said potential boosting circuit is a word line potential boosting circuit for outputting said second power-supply potential to said word line driving circuit.

15. A semiconductor device according to any one of claims 6, 7, 8, and 9, further comprising a memory cell and a word line connected to said memory cell, wherein said second circuit block includes an output buffer; and said potential boosting circuit outputs said second power-supply potential to said output buffer.

16. A semiconductor device according to any one of claims 10, 11, 12, and 13, further comprising a memory cell and a word line connected to said memory cell, wherein said first circuit block includes a word line driving circuit for driving said word line.

17. A semiconductor device according to any one of claims 10, 11, 12, and 13, further comprising a memory cell and a word line connected to said memory cell, wherein said first circuit block includes an output buffer.

* * * * *